(12) United States Patent
Kim

(10) Patent No.: US 6,925,285 B2
(45) Date of Patent: Aug. 2, 2005

(54) APPARATUS FOR TRANSMITTING AND RECEIVING MPEG DATA BY USING WIRELESS LAN

(75) Inventor: Jae-Geun Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 397 days.

(21) Appl. No.: 10/254,409

(22) Filed: Sep. 25, 2002

(65) Prior Publication Data

US 2003/0064679 A1 Apr. 3, 2003

(30) Foreign Application Priority Data

Sep. 28, 2001 (KR) .......................................... 2001-60763

(51) Int. Cl.$^7$ ................................................. H04B 1/00
(52) U.S. Cl. ..................... 455/3.02; 455/13.1
(58) Field of Search ................. 455/3.02, 7, 426.2, 455/427, 41.2; 725/62, 63, 74, 71, 135, 138, 139, 131; 370/279

(56) References Cited

U.S. PATENT DOCUMENTS 6,493,873 B1 * 12/2002 Williams .................... 725/78
6,609,097 B2 * 8/2003 Costello et al. ............. 704/500
2002/0038459 A1 * 3/2002 Talmola et al. ............... 725/81

* cited by examiner

Primary Examiner—Nick Corsaro
Assistant Examiner—Tu X Nguyen
(74) Attorney, Agent, or Firm—Lee, Hong, Degerman, Kang & Schmadeka

(57) ABSTRACT

An apparatus for transmitting and receiving an MPEG data using a wireless LAN includes a first satellite broadcast receiver, a first data controller, a first radio data transceiver, a second radio transceiver, a second data controller and a second satellite broadcast receiver. The first radio data transceiver converts a satellite broadcast signal inputted from the first data controller and transmits it to the second radio transceiver. The second data controller controls a transmission path of the satellite broadcast signal according to determining whether the satellite broadcast signal has been encoded. The second satellite broadcast receiver decodes the satellite broadcast signal inputted from the second data controller to reproduce a moving picture or a voice.

11 Claims, 7 Drawing Sheets

| | DVB SATELLITE BROADCAST DAVIC* | IEEE802.11a |
|---|---|---|
| RS CODE PRIMITIVE POLYNOMIAL | (204,188) $x^8+x^4+x^3+x^2+1$ | (244,208),(204,188)* $x^8+x^4+x^3+x^2+1$ |
| GENERATOR POLYNOMIAL | $g(x)=\prod_{i=0}^{2t-1}(x-\beta^i)$ | $g(x)=\prod_{i=1}^{2t}(x-\beta^i)$ |
| CONVOLUTIONAL CODER CODER STRUCTURE PUNCTURE PATTEN CODING RATE 2/3 3/4 | 1/2,2/3,2/4,5/6,7/8 g1=[171] g2=[133] [10] [11] [101] [110] | 1/2,2/3,3/4 g1=[133] g2=[171] [11] [10] [111] [101] |

| | 800 | | | 810 | | | | 820 |
|---|---|---|---|---|---|---|---|---|
| MAC HEADER | | | FRAME BODY | | | | | FCS |
| HEADER | HEADER FEC | SECURITY IV+ MSDU1+ICV | FEC | MSDU₂ | ... | MSDU +ICV +"FEC FCS" | FEC | FCS |
| 32 | 16 | 208 | 16 | 208 | ... | 4+UPTO 208 | 16 | 4 |

| | 900 | | | 910 | | | | 920 |
|---|---|---|---|---|---|---|---|---|
| MAC HEADER | | | FRAME BODY | | | | | FCS |
| HEADER | HEADER FEC | SECURITY IV+ MSDU1+ICV | FEC | MSDU₂ | ... | MSDU +ICV +"FEC FCS" | FEC | FCS |
| 32 | 16 | 188 | 16 | 188 | ... | 4+UPTO 188 | 16 | 4 |

APPARATUS FOR TRANSMITTING AND RECEIVING MPEG DATA BY USING WIRELESS LAN

BACKGROUND OF THE INVENTION

1. Field of the Invention

The present invention relates to an apparatus for transmitting and receiving an MPEG data using a wireless LAN and, more particularly, to an apparatus for transmitting and receiving an MPEG data by using a wireless LAN that is capable of wirelessly transmitting and receiving a voice or an image data by effectively combining a device such as a satellite broadcast receiver or a cable TV with a different communication protocol with a wireless transceiver.

2. Description of the Background Art

In general, a satellite broadcast is directly transmitted to homes, for which a communication satellite which is high up at an equatorial altitude of 36000 km, mounting various electronic equipment, relay equipment and solar battery board, serves as a repeater station.

A satellite broadcast receiver for receiving a satellite broadcast from the communication satellite includes a satellite antenna for receiving a satellite signal, a set-top box for processing a satellite signal received by the satellite antenna and outputting it, and a TV for receiving an image signal processed in the set-top box and displaying it.

The set-top box is connected to the satellite antenna installed outdoors through a cable, demodulates a voice/image data received through the cable connected to the satellite antenna and outputs it.

However, as described above, in the case that the satellite broadcast is received through the set-top box connected to the satellite antenna through the cable, there occurs an inconvenience that the cable should be connected long from the satellite antenna installed outdoors to the set-top box positioned indoors.

In addition, in case that a satellite broadcast viewer desires to view a satellite broadcast in a different place indoors, the cable should be extended long up to the place as he/she moved.

SUMMARY OF THE INVENTION

Therefore, an object of the present invention is to provide an apparatus for transmitting and receiving an MPEG data using a wireless LAN in which a satellite broadcast receiver and a wireless transceiver in conformity to an IEEE802.11a protocol are effectively combined.

Another object of the present invention is to provide an apparatus for transmitting and receiving an MPEG data using a wireless LAN in which a cable TV and a wireless transceiver in conformity to an IEEE802.11a protocol are effectively combined.

To achieve these and other advantages and in accordance with the purpose of the present invention, as embodied and broadly described herein, there is provided an apparatus for transmitting and receiving an MPEG data using a wireless LAN including: a first satellite broadcast receiver for decoding a satellite broadcast signal received through a satellite broadcast antenna and reproducing a mobile image and a voice; a first data controller for receiving a satellite broadcast signal decoded from the first satellite broadcast receiver; a first radio data transceiver for selectively coding the satellite broadcast signal inputted from the first data controller, and converting the inputted satellite broadcast signal or the coded satellite broadcast signal into a radio frequency signal and wirelessly transmitting it; a second radio data transceiver for receiving the satellite broadcast signal of the radio frequency signal received from the first radio data transceiver; a second data controller for determining whether the satellite broadcast signal received by the second radio data transceiver has been coded and controlling a transmission path of the satellite broadcast signal according to the determining result; and a second satellite broadcast receiver for decoding the coded satellite broadcast signal received from the second data controller or data-processing the satellite broadcast signal inputted from the second data controller to reproduce a mobile image or a voice, wherein first and second satellite broadcast receivers performs a data communication in conformity to a DVB communication standard, and first and second radio data transceivers performs a data communication in conformity to an IEEE802 communication protocol.

To achieve the above objects, there is also provided an apparatus for transmitting and receiving an MPEG data using a wireless LAN including: a first cable TV for decoding a broadcast signal inputted through a cable and reproducing a mobile image or a voice; a first data controller for receiving a decode broadcast signal; a first radio data transceiver for selectively coding the broadcast signal inputted from the first data controller, converting the inputted broadcast signal or the coded broadcast signal into a radio frequency signal and wirelessly transmitting it; a second radio data transceiver for receiving a broadcast signal of the radio frequency signal received from the first radio data transceiver; a second data controller for determining whether the broadcast signal received by the second radio data transceiver has been coded, and controlling a transmission path of the broadcast signal according to the determining result; and a second cable TV for decoding the coded broadcast inputted from the second data controller or data-processing the broadcast signal inputted from the second data controller to reproduce a mobile image and a voice.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
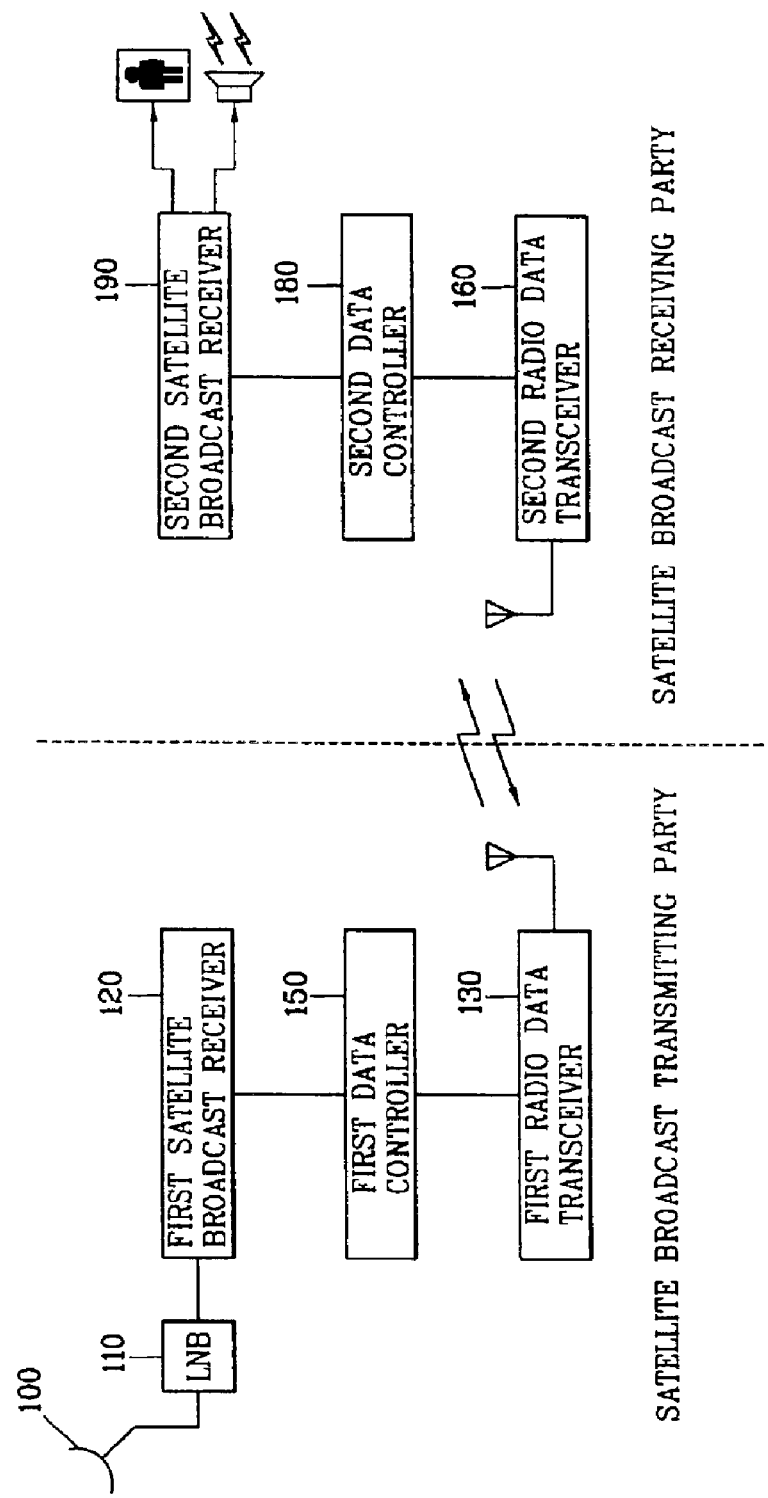
FIG. 1 is a schematic block diagram of an apparatus for transmitting and receiving an MPEG data using a wireless LAN in accordance with one embodiment of the present invention.

FIG. 1 is a schematic block diagram of an apparatus for transmitting and receiving an MPEG data using a wireless LAN in accordance with one embodiment of the present invention.

As shown in FIG. 1, an apparatus for transmitting and receiving an MPEG data using a wireless LAN in accordance with one embodiment of the present invention includes a low noise block down converter (LNB) 110 for down-converting a frequency of a satellite broadcast signal received through a satellite antenna 100 and outputting it; a first satellite broadcast receiver 120 for demodulating the down-converted satellite broadcast signal inputted from the LNB 110 and outputting it; a first data controller 150 for outputting the satellite broadcast signal outputted after being demodulated from the first satellite broadcast receiver 120 to a first radio data transceiver 130 so as to transmit the satellite broadcast signal as a radio signal; a second radio data transceiver 160 for demodulating the satellite broadcast signal in a radio signal form received from the first radio data transceiver 130 and outputting it; a second data controller 180 for controlling a transmission path according to whether the satellite broadcast signal received through the second radio data transceiver 160 has been RS-coded; and a second satellite broadcast receiver 190 for data-processing the inputted satellite broadcast signal as the transmission path is controlled by the second data controller 180, and reproducing it.

Figure 2:
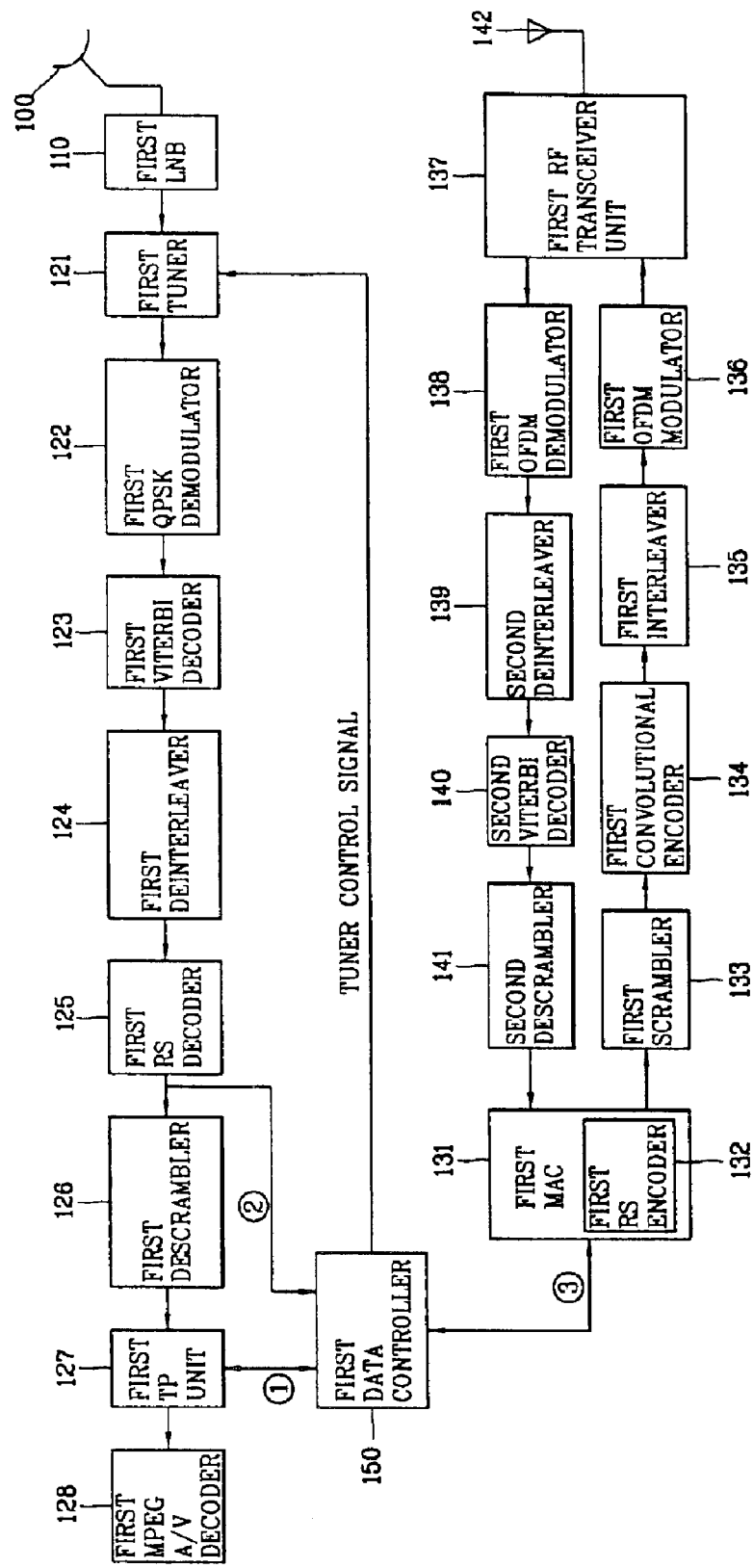
FIGS. 2 and 3 are detailed block diagrams of FIG. 1.

The first satellite broadcast receiver 120, the first radio data transceiver 130 and the first data controller 150 are constructed as shown in FIG. 2.

With reference to FIG. 2, the first satellite broadcast receiver 120 includes a first tuner 121 for selectively outputting a particular frequency band or a channel signal among the satellite broadcast signal inputted from the LNB 110, a first quadrature phase shift keying (QPSK) demodulator 122 for demodulating the satellite broadcast signal inputted from the first tuner 121 and outputting it; a first Viterbi decoder 123 for Viterbi-decoding the demodulated satellite broadcast signal; a first deinterleaver 124 for deinterleaving the decoded satellite broadcast signal and outputting it; a first reed solomon (RS) decoder 125 for decoding the deinterleaved satellite broadcast signal in order to correct an error of it; a first descrambler 126 for descrambling the satellite broadcast signal decoded in the first RS decoder 125 to an MPEG transmission stream; and a first transport unit 127 for extracting only desired information from the descrambled satellite broadcast signal.

At this time, the first satellite broadcast receiver 120 may include a first MPEG A/V decoder 128 for outputting a satellite broadcast signal processed by the first TP unit 127.

As shown in FIG. 2, the first radio data transceiver 130 includes a first media access controller (MAC) 131 for receiving a satellite broadcast signal from the first satellite broadcast receiver 120 through the first data controller 150, a first RS encoder 132 for coding the satellite broadcast signal inputted into the first MAC 131 to an RS code; a first scrambler 133 for scrambling the satellite broadcast signal inputted from the first MAC 131 or the satellite broadcast signal coded from the first RS encoder 132; a first convolutional encoder 134 for coding the scrambled satellite broadcast signal to a convolutional code; a first interleaver 135 for interleaving the satellite broadcast signal which has been coded to the convolutional code; a first orthogonal frequency division multiplexing (OFDM) modulator 136 for modulating the interleaved satellite broadcast signal; a first RF transceiver unit 137 for converting the modulated satellite broadcast signal into a radio signal of a 5 GHz band and transmitting it through the first radio antenna 142, or lowering the 5 GHz radio signal received through the first radio antenna 142 to a base band; a first OFDM demodulator 138 for demodulating a signal inputted from the first RF transceiver unit 137; a second deinterleaver 139 for deinterleaving the demodulated signal; a second Viterbi Decoder 140 for decoding the deinterleaved signal; and a second descrambler 141 for descrambling the decoded signal and outputting it to the first MAC 131.

The first data controller 150 outputs an output signal of the first RS decoder 125 or an output signal of the first TP unit 127 to the first MAC 131.

Also, the first data controller 150 outputs a tuner control signal to the first tuner 121 according to a channel select request signal inputted from the first MAC 131.

Figure 3:
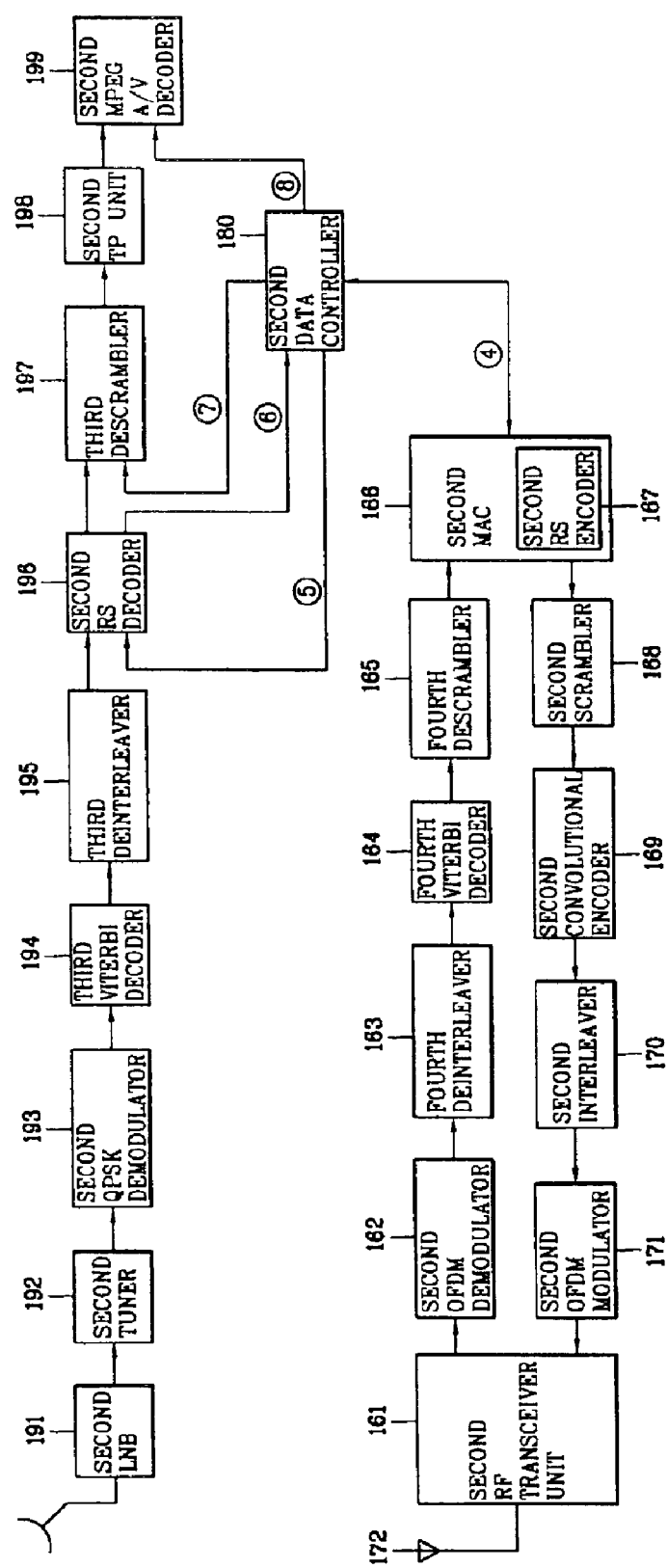

With reference to FIG. 3, the second satellite broadcast receiver 190 includes a second LNB 191, a second tuner 192, a second QPSK demodulator 183, a third Viterbi decoder 194, a third deinterleaver 195, a second RS decoder 196, a third descrambler 197, a second TP unit 198 and a second MPEG A/V decoder 199.

The second radio data transceiver 160 includes a second RF transceiver unit 161, a second OFDM demodulator 162, a fourth interleaver 163, a fourth Viterbi decoder 164, a fourth descrambler 165, a second MAC 166, a second RS encoder 167, a second scrambler 168, a second convolutional encoder 169, a second interleaver 170, a second OFDM modulator 171 and a second radio antenna 172.

The second satellite broadcast receiver 190 has the same connection construction as that of the first satellite broadcast receiver 120, and the second radio data transceiver 160 has the same connection construction as that of the first radio data transceiver 130.

The second data controller 180 is constructed such that it outputs a satellite broadcast signal inputted from the second radio data transceiver 160 to the second RS decoder 196, the second TP unit 198 or the MPEG AV decoder 199 depending on whether the satellite broadcast signal has been RS-coded.

If the first satellite broadcast receiver 120 is used at the side of a satellite broadcast transmitting party which receives a satellite broadcast and transmits it as a radio signal, the first MPEG A/V decoder 128 is not necessary in the construction.

If the second satellite broadcast receiver 190 is used at the side of a satellite broadcast receiving party which receives a satellite broadcast in a radio signal form, the second LNB 191, the second tuner 192, the second QPSK demodulator 193, the third Viterbi decoder 194 and the third deinterleaver 195 are not necessary in the construction.

In the apparatus for transmitting and receiving an MPEG data using a wireless LAN in accordance with one embodiment of the present invention, the first and second satellite broadcast receivers 120, 190 perform a data communication in conformity to a digital video broadcasting (DVB) communication standard to receive an audio/video data, and the first and second radio data transceivers 130, 160 perform a data communication in conformity to an IEEE802.11a standard to receive an audio/video data.

Performing a data communication, as aforementioned, by coupling the first and second satellite broadcast receivers 120 and 190 and the first and second radio data transceivers 130 and 160 which have different data communication standard from each other will now be described.

Figures 4, 5:
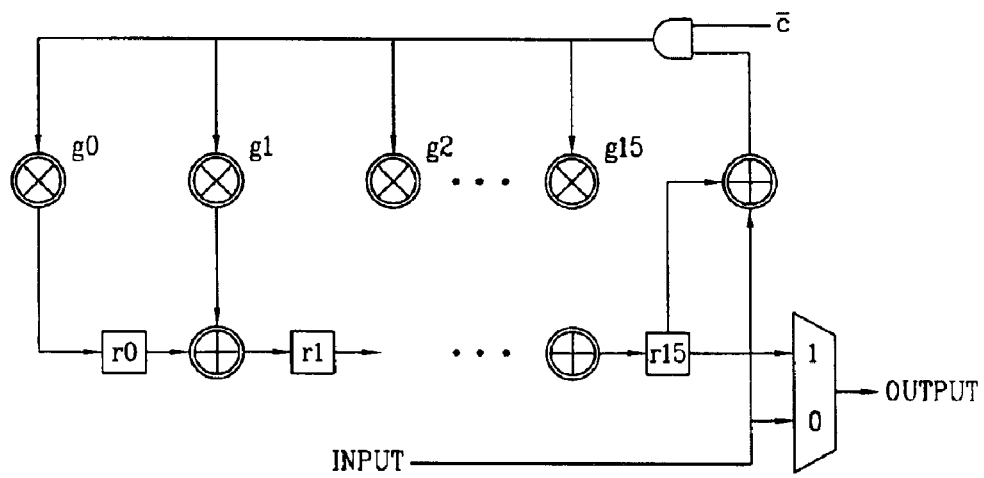
FIG. 4 is a table showing differences between a DVB standard and an IEEE802.11a standard.
FIG. 5 is a block diagram of an RS encoder.

FIG. 4 is a table showing differences between a DVB standard and an IEEE802.11a standard.

With reference to FIG. 4, in the DVB standard and the IEEE802.11a standard, primitive polynomial of the RS code are the same with each other and only one item of a generator polynomial is different.

That is, in case of the RS code which is used for coding a data in first and second RS encoder 132, 167 of the first and second radio data transceivers 130, 160 or decoding a data in the first and second RS decoders 125, 196 of the first and second satellite broadcast receivers 120, 190, it can be used with some correction in both the DVB standard and the IEEE802.11a standard, which will now be described.

FIG. 5 is a block diagram of an RS encoder.

In the RS encoder, a generator polynomial (g(x)) of a particular bit and an input data are operated by means of a plurality of multipliers and a plurality of adders, an output data is outputted.

Namely, in case of the DVB standard, the RS encoder selects and applies generator polynomial coefficients $g_{1-DVB}$ (I=0, . . . , 16) fitting the DVB standard, while in case of the IEEE802.11a standard, the RS encoder selects and applies generator polynomial coefficients $g_{i-802}$(I=0, . . . , 16), thereby performing a coding.

Thus, the RS encoder can be used for both of the DVB standard and the IEEE802.11a according to selectively applying a generator polynomial coefficient fitting each communication standard.

Figure 6:
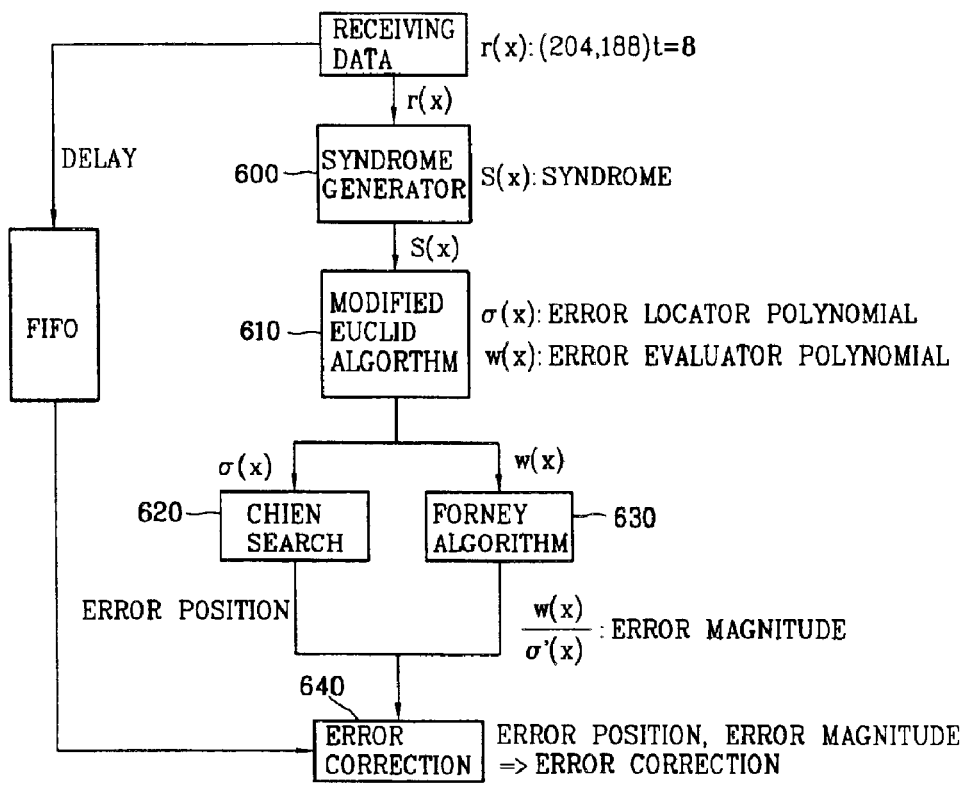
FIG. 6 is a block diagram of an RS decoder.

FIG. 6 is a block diagram of an RS decoder.

As shown in FIG. 6, the RS decoder includes a syndrome generator 600 for calculating and outputting a syndrome (S(x)) of a receiving data; a modified Euclid algorithm 610 for calculating an error locator polynomial (σ(x)) and an error evaluator polynomial (w(x)) by the syndrome (S(x)) inputted from the syndrome generator 600 and the generator polynomial of the RS code; a chien search 620 for calculating an error locator of a receiving data by using the error locator polynomial (σ(x)) calculated by the modified Euclid algorithm 610 and outputting it; a Forney algorithm 630 for calculating an error value by using the error evaluator polynomial (w(x)) calculated by the Forney algorithm 630 and outputting it, and an error corrector 640 for correcting an error of the receiving data by the error locator and the error value calculated by the chien search 620 and the Forney algorithm 630.

In the generator polynomial used when calculating the syndrome (S(x)) of the receiving data by means of the syndrome generator 600, the DVB standard and the IEEE802.11a standard are different in one item as shown in the below equation (1).

$$g_{DVB}(x)=(x-\beta^0)(x-\beta^1)\ldots(x-\beta^{15})$$
$$g_{IEEE}(x)=(x-\beta^1)\ldots(x-\beta^{15})(x-\beta^{16})$$

As shown in equation (1), in the generator polynomial used for the syndrome calculation, only one item is different and the remaining 15 items are the same with each other in the DVB standard and the IEEE802.11a standard.

Therefore, when the RS decoder calculates the syndrome, R(β0) is obtained in the DVB standard while R(β16) is obtained in the IEEE802.11a, and the following every process is the same.

As stated above, adopting of the RS encoder and the RS decoder to both of the DVB standard and the IEEE802.11a standard can be easily implemented by hardware or software.

The convolutional encoder and the Viterbi decoder will now be described.

Figures 7, 8, 9:
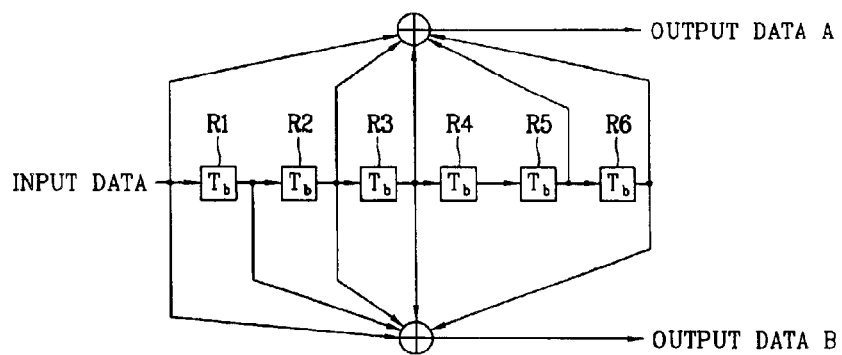
FIG. 7 is a block diagram showing a ½ convolutional encoder of IEEE802.11a standard.
FIG. 8 is a view showing a forward error correction frame structure in accordance with a shortened RS code used in the EEE802.11a standard.
FIG. 9 is a view showing a forward error correction frame structure in accordance with a shortened RS code used in a DVB standard.

FIG. 7 is a block diagram showing a ½ convolutional encoder of IEEE802.11a standard.

The ½ convolutional encoder of the IEEE802.11a standard has the same structure as that of the DVB standard, but the fetch order of an output data is different from each other.

As shown in FIG. 7, the ½ convolutional encoder of the IEEE802.11a standard consists of 1 bit input data, first through sixth registers (R1, . . . , R6) storing the previous data, and 2 bit output data (an output data 'A' and an output data 'B').

In general, a structure of the convolutional encoder is expressed in the form as shown in FIG. 4. The structure of the convolutional encoder of the IEEE802.11a standard is expressed by g1=[133],g2=[171], and the structure of the convolutional encoder of the DVB standard is expressed by g1=[181], g2=[133].

The structure of the above expressed convolutional encoder is expressed as an octal value. In case that the structure is expressed by a binary value, the structure of the convolutional encoder of the IEEE802.11a is expressed by g1=[1 011 011], g2=[1 111 001], and the structure of the convolutional encoder of the DVB standard is expressed by g1=[1 111 001], g2=[1 011 011].

That is, in order to obtain the first and second output data (A, B), the structure of the convolutional encoder is expressed according to a connection state of an input data or first through sixth registers (R1, . . . , R6). A state that, in order to obtain the first or the second output data (A, B), an output is connected to an input data or to a first through sixth register is expressed by '1', while a state that an output is not connected to an input data or to a first through sixth register is expressed by '0'

The structure of the convolutional encoder to obtain the first output data (A) is [1 011 011], and the structure to obtain the second output data (B) is [1 111 001].

Therefore, the convolutional encoder of the IEEE802.11a fetches the first output data (A) and then fetches the second output data (B). Meanwhile, the convolutional encoder of the DVB standard fetches the second output data (B) and then the first output data (A).

After performing the ½ convolutional coding, the convolutional encoder performs puncturing to remove a portion of the first and second output data (A, B) by using the first and second output data (A, B) as input data.

A puncture pattern of the convolutional encoder in conformity to the DVB standard and a puncture pattern of the convolutional encoder in conformity to the IEEE802.11a are different only in the order of puncturing like in the coder structure.

That is, as shown in FIG. 4, if the code rate is ⅔, the puncture pattern in the DVB standard is [10][11], while the puncture pattern in the IEEE802.11a standard is [11][10].

In addition, if the code rate is ¾, the puncture pattern in the DVB standard is [101][110], and the puncture pattern in the IEEE802.11a is [110][101].

Therefore, since the convolutional encoder in conformity of the IEEE802.11a standard and the convolutional encoder in conformity of the DVB standard have puncture patterns of which only the fetch order of the output data is different, the fetch order of the output data has only to be selected by using the same convolutional encoder.

In addition, the IEEE802.11a standard and the DVB standard use the same Viterbi decoder, and the order of defuncturing in conformity to the DVB standard or the IEEE802.11a standard and a corresponding branch metric and a decision vector have only to be selected.

As stated above, by partially changing the encoder and the decoder, the channel coding of the DVB standard and a channel coding of the IEEE802.11a can be supported Thus, as shown in FIG. 1, a satellite broadcast signal received by the first satellite broadcast receiver 120 in conformity to the DVB standard is converted into a radio signal by the first radio data transceiver 130 and transmits it.

Subsequently, the second radio data transceiver 160 receives the radio data from the first radio data transceiver 130 and then outputs the received data to the second satellite broadcast receiver 190, and the second satellite broadcast receiver 190 demodulates the data inputted from the second radio data transceiver 160 and outputs it.

The operation of the apparatus for transmitting and receiving an MPEG data by using a wireless LAN in accordance with the present invention will now be described.

First, the first tuner 121 of the first satellite broadcast receiver 120 selects a particular frequency band or a channel signal from the satellite broadcast signal inputted from the first LNB 110 after being frequency-converted and outputs it to the first QPSK demodulator 122.

The first QPSK demodulator 122 demodulates the satellite broadcast signal inputted from the first tuner 121 and outputs it to the first Viterbi decoder 123, and the first Viterbi decoder 123 decodes the demodulated satellite broadcast signal and outputs it to the first deinterleaver 124.

The first deinterleaver 124 deinterleaves the decoded satellite broadcast signal and outputs it to the first RS decoder 125, and the first RS decoder 125 decodes the deinterleaved satellite broadcast signal by the RS code and outputs it to the first descrambler 126 or to the first data controller 150 through a signal path (2).

The first descrambler 126 descrambles the satellite broadcast signal which has been decoded by the RS code and outputs it to the first TP unit 127, and the first TP unit 127 data-processes the descrambled satellite broadcast signal and outputs it to the first data controller 150 through a signal path (1).

The signal inputted to the first data controller 150 through the signal path (2) after being outputted from the first RS decoder 125 is a signal that a plurality of programs are contained in a channel selected by the first tuner 121, and the signal inputted to the first data controller 150 through the signal path (1) after being outputted from the first TP unit 127 is one of a program signals selected from a plurality of programs contained in a channel.

The first data controller 150 outputs the decoded satellite broadcast signal inputted from the first RS decoder 125 or the data-processed satellite broadcast signal inputted from the first TP unit 127 to the first MAC 131 of the first radio data transceiver 130 through the signal path (3).

The first MAC 131 transmits the satellite broadcast signal inputted from the first data controller 150 to the first scrambler 133 or the inputted satellite broadcast signal to the first RS encoder 132.

The first RS encoder 132 performs an RS coding used in the DVB standard on the inputted satellite broadcast signal.

In general, as shown in FIG. 8, the forward error correction frame according to the shortened RS code used in the IEEE802.11a standard includes a MAC header 800 using a shortened RS code having a 32 byte input data and a 16 byte redundancy, a frame body 810 using a shortened RS code having a 208 byte input data and a 16 byte redundancy, and a 4 byte FCS (Frame Check Sequence) 820 for checking a frame error.

In the present invention, the first RS encoder 132 encodes the inputted satellite broadcast signal by the shortened RS code used in the DVB standard, and a forward error correction frame structure used in this case is as shown in FIG. 9.

With reference to FIG. 9, the forward error correction frame according to the shortened RS code used in the DVB standard includes a MAC header 900 using a shortened RS code having a 32 byte input data and a 16 byte redundancy, a frame body 910 using a shortened RS code having a 188 byte input data and a 16 byte redundancy, and a 4 byte FCS 920 for checking an error of a frame.

That is, the data frames includes a MAC header using (48,32) shortened RS code and a frame body using (204, 188) shortened RS code.

In this respect, since the data frame has the total 2304 byte, it can be constructed with 11 (204,188) shortened RS codes.

Compared with the RS coding according to the (224,208) shortened RS codes used in the IEEE802.11a standard, the data frame structure as shown in FIG. 9 does not exhibit any difference in the performance in view of a transmission efficiency.

The first MAC 131 can perform an RS coding by the first RS encoder 132 on the satellite broadcast signal inputted from the first data controller 150, or can output the satellite broadcast signal directly to the first scrambler 133 without performing the RS coding thereon.

The first scrambler 133 scrambles the satellite broadcast signal inputted from the first MAC 131 and outputs it to the first convolutional encoder 134, and the first convolutional encoder 134 encodes the scrambled satellite broadcast signal according to the convolutional code and outputs it to the first interleaver 135.

The first interleaver 135 interleaves the convolutionally coded satellite broadcast signal and outputs it to the first OFDM modulator 136, and the first OFDM modulator 136 frequency-modulates the interleaved satellite broadcast signal and outputs it to the first RF transceiver unit 137.

The first RF transceiver unit 137 converts the frequency-modulated satellite broadcast signal into a radio frequency signal and transmits it to the second radio data transceiver 160 through the first radio antenna 142.

At this time, when the second radio data transceiver 160 receives the satellite broadcast signal from the first radio data transceiver 130, it does not transmit a response signal (ACK) indicating existence or nonexistence of an error in a receiving signal to the first radio data transceiver 130.

Since the first radio data transceiver 130 transmits the satellite broadcast signal irrespective of existence or nonexistence of a receiving signal, it performs a transmitting operation of the satellite broadcast signal regardless of whether a response signal is received or not from the second radio data transceiver 160.

The second RF transceiver unit 161 of the second radio data transceiver 160 lowers the satellite broadcast signal in the radio frequency form received from the first RF transceiver unit 137 through the second radio antenna 172 to a base band, and outputs it to the second OFDM demodulator 162.

The second OFDM demodulator 162 demodulates the satellite broadcast signal of which frequency has been downed to a base band, and outputs it to the fourth deinterleaver 163, and the fourth deinterleaver 163 deinterleaves the demodulated satellite broadcast signal and outputs it to the fourth Viterbi decoder 164.

The fourth Viterbi decoder 164 decodes the deinterleaved satellite broadcast signal and outputs it to the fourth descrambler 165, the fourth descrambler 165 descrambles the decoded satellite broadcast signal and outputs it to the second MAC 166, and the second MAC 166 receives the descrambled satellite broadcast signal and outputs it to the second data controller 180.

The second data controller 180 determines whether the satellite broadcast signal (4) inputted from the second MAC 166 has been coded or not by the first RS encoder 132 of the first radio data transceiver 130.

In this respect, if the inputted satellite broadcast signal has been coded, the second data controller 180 outputs the satellite broadcast signal (4) inputted from the second MAC 166 to the second RS decoder 196. If the inputted satellite broadcast signal has not been coded, the second data controller 180 outputs the satellite broadcast signal to the third descrambler 197 or to the MPEG A/V decoder 199 through the signal path (7) or (8).

At this time, if the satellite broadcast signal inputted through the signal path (4) from the second MAC 166 is an output signal of the first RS decoder 125 of the first satellite broadcast receiver 120, the second data controller 180 outputs the satellite broadcast signal to the descrambler 197.

If the satellite broadcast signal inputted through the signal path (4) from the second MAC 166 is an output signal of the first TP unit 127 of the first satellite broadcast receiver 120, the second data controller 180 outputs the satellite broadcast signal to the MPEG AN decoder 199.

The second RS decoder 196 decodes the satellite broadcast signal (5) inputted from the second data controller 180 and outputs it to the second data controller 180 through the signal path (6), or outputs it to the third descrambler 197. The third descrambler 197 descrambles the decoded satellite broadcast signal and outputs it to the second TP unit 198.

The second RS decoder 196 decodes the coded satellite broadcast signal according to the shortened RS code as shown in FIG. 9.

If the satellite broadcast signal inputted from the second RS decoder 196 is an output signal of the first TP unit 127 of the first satellite broadcast receiver 120, the second data controller 180 outputs the satellite broadcast signal to the second MPEG A/V decoder 199.

The second TP unit 198 data-processes the descrambled satellite broadcast signal or the satellite broadcast signal inputted from the second data controller 180 and outputs it to the second MPEG A/V decoder 199.

The second MPEG A/V decoder 199 decodes the data-processed satellite broadcast signal or the satellite broadcast signal inputted from the second data controller 180 by the MPEG method.

Meanwhile, when a user inputs a channel conversion request signal by using a remote controller (not shown), the channel conversion request signal is inputted to the second MAC 166 of the second radio data transceiver 160.

The second radio data transceiver 160 codes, interleaves and modulates the channel conversion request signal inputted to the second MAC 166 by the second scrambler 168, the second convolutional encoder 169, the second interleaver 170 and the second OFDM demodulator 171, converts it to a radio signal and transmits it to the first radio data transceiver 130 by the second RF transceiver unit 161.

The first radio data transceiver 130 receives the channel conversion request signal from the second data transceiver 160, data-processes the received channel conversion request signal by the first OFDM demodulator 138, the second deinterleaver 139, the second Viterbi decoder 140 and the second descrambler 141, and outputs it to the first data controller 150 through the first MAC 131.

The first data controller 150 outputs a tuner control signal to the first tuner 121 for a channel conversion according to the channel conversion request signal inputted from the first radio data transceiver 130.

The first tuner 121 performs a channel conversion according to the tuner control signal inputted from the first data controller 150.

The operation of the forward path in which the satellite broadcast signal received by the first satellite broadcast receiver 120 is converted into the radio signal by the first radio data transceiver 130 and transmitted to the second radio data transceiver 130, has been described, but conversely, the operation of the backward path in which the satellite broadcast signal received by the second satellite broadcast receiver 180 is converted into a radio signal by the second radio data transceiver 160 and transmitted to the first radio data transceiver 130 can be possibly performed.

Figure 10:
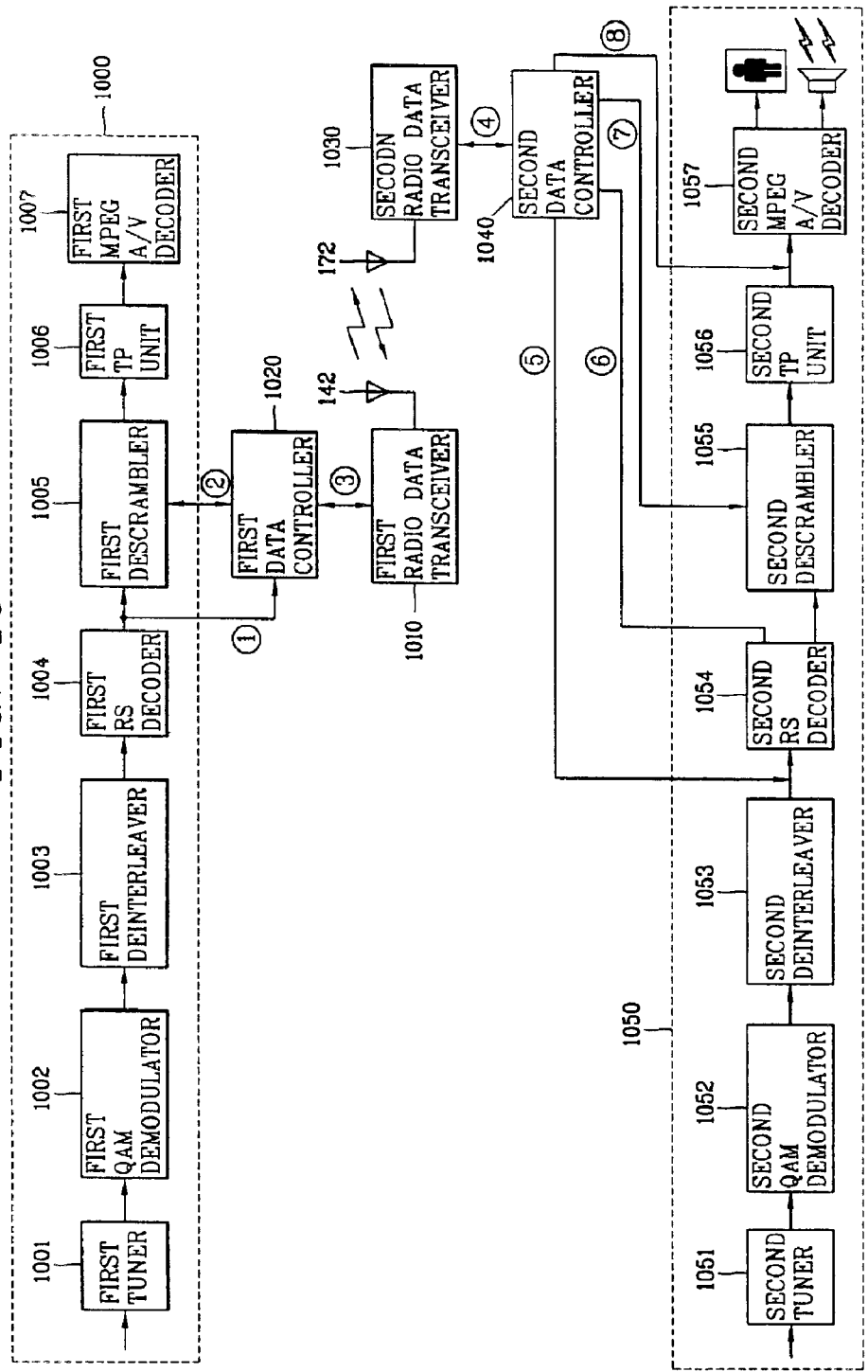
FIG. 10 is a block diagram of an apparatus for transmitting and receiving an MPEG data using a wireless LAN in accordance with another embodiment of the present invention.

FIG. 10 is a block diagram of an apparatus for transmitting and receiving an MPEG data using a wireless LAN in accordance with another embodiment of the present invention.

With reference to FIG. 10, an apparatus for transmitting and receiving an MPEG data using a wireless LAN in accordance with another embodiment of the present invention including: a first cable TV 1000 for data-processing an audio/video signal inputted through a cable and reproducing it; a first radio data transceiver 1010 for converting the audio/video signal inputted from the first cable TV 1000 into a radio signal and transmitting it; a first data controller 1020 for outputting the audio/video signal inputted to the first cable TV 1000 to the first radio data transceiver 1010; a second radio data transceiver 1030 for converting the audio/video signal in a radio signal form received from the first radio data transceiver 1010 so as to have a base band frequency; a second data controller 1040 for controlling a transmission path depending on whether the audio/video signal inputted from the second radio data transceiver 1030 has been coded or not; and a second cable TV 1050 for data-processing the audio/video signal of which the transmission path has been controlled by the second data controller 1040 and outputting it to a user.

The first cable TV 1000 includes a first tuner 1001 for selecting a channel of an audio/video signal inputted through a cable; a first quadrature amplitude modulation (QAM) demodulator 1002 for demodulating a signal inputted from the first tuner 1001; a first deinterleaver 1003 for deinterleaving the demodulated signal; a first RS decoder 1004 for decoding the deinterleaved signal; a first descrambler 1005 for descrambling the decoded signal; a first TP unit 1006 for data-processing the descrambled signal; and a first MPEG A/V decoder 1007 for decoding the data-processed signal and reproducing it.

The second cable TV 1050 includes a second tuner 1051, a second QAM demodulator 1052, a second deinterleaver 1053, a second RS decoder 1054, a second descrambler 1055, a second TP unit 1056 and a second MPEG A/V decoder 1057.

Another embodiment of the present invention has a construction of combining the first and second radio data transceivers 1010 and 1030 and the first and second cable TVs 1000 and 1050.

Accordingly, another embodiment of the present invention has the same construction as the former embodiment of the present invention, except for the internal construction of the first and second cable TVs 1000 and 1050, detailed descriptions of which are thus omitted.

The operation of the apparatus for transmitting and receiving an MPEG data using a wireless LAN in accordance with another embodiment of the present invention will now be described.

The first RS decoder 1004 and the first TP unit 1006 of the first cable TV 1000 output broadcast signals (1) and (2) inputted through a cable to the first data controller 1020, and the first data controller 1020 outputs the broadcast signals inputted from the first cable TV 1000 to the first radio data transceiver 1010.

The first radio data transceiver 1010 converts the broadcast signal inputted form the first data controller 1020 into a radio frequency signal and transmits it to the second radio data transceiver 1030 through the first radio antenna 142.

The second radio data transceiver 1030 processes the broadcast signal in the radio frequency signal form received from the first radio data transceiver 1010 and outputs it to the second data controller 1040.

The second data controller 1040 controls a transmission path to the second cable TV 1050 depending on whether the broadcast signal inputted from the second radio data transceiver 1030 has been coded or not according to the RS code.

That is, if the inputted broadcast signal (4) is a signal which has been coded according to the RS code in the first radio data transceiver 1010, the second data controller 1050 outputs it to the second RS decoder 1054. If the inputted broadcast signal (4) has not been coded according to the RS code, the second data controller 1050 outputs it to the second descrambler 1055 or to the second MPEG ANV decoder 1057 (7), (8).

The second RS decoder 1054 decodes the broadcast signal inputted from the second data controller 1040 and outputs it to the second data controller 1040 (6) or to the second descrambler 1055.

As so far described, in the present invention, as the RS coding used in the DVB standard is used in order to converts the satellite broadcast signal into a radio signal and transmit the radio signal, the satellite broadcast receiver and the radio data transceiver in the IEEE802.11a standard can be combined.

Accordingly, in the present invention, the satellite broadcast signal can be transmitted and received in the radio signal form by the radio data transceiver, so that a satellite broadcast can be conveniently received irrespective of a place.

In addition, by combining the cable TV and the radio data transceiver, a cable broadcast can be also conveniently viewed irrespective of a place, an indoor space can be effectively utilized.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such metes and bounds are therefore intended to be embraced by the appended claims.

What is claimed is:

1. An apparatus for transmitting and receiving an MPEG data using a wireless LAN comprising:
 a first satellite broadcast receiver for decoding a satellite broadcast signal received through a satellite broadcast antenna and reproducing a moving picture and a voice;
 a first data controller for receiving a satellite broadcast signal decoded from the first satellite broadcast receiver;
 a first radio data transceiver for selectively coding the satellite broadcast signal inputted from the first data controller, and converting the inputted satellite broadcast signal or the coded satellite broadcast signal into a radio frequency signal and wirelessly transmitting it;
 a second radio data transceiver for receiving the satellite broadcast signal of the radio frequency signal received from the first radio data transceiver;
 a second data controller for determining whether the satellite broadcast signal received by the second radio data transceiver has been coded and controlling a transmission path of the satellite broadcast signal according to the determining result; and
 a second satellite broadcast receiver for decoding the coded satellite broadcast signal received from the second data controller or data-processing the satellite broadcast signal inputted from the second data controller to reproduce a moving picture or a voice,
 wherein the first and second satellite broadcast receivers performs a data communication in conformity to a DVB communication standard, and the first and second radio data transceivers performs a data communication in conformity to an IEEE802 communication standard.

2. The apparatus of claim 1, wherein the first satellite broadcast receiver comprises:
 an LNB for frequency-converting the received satellite broadcast signal and outputting it;
 a tuner for selecting a particular frequency band or a channel from the satellite broadcast signal inputted from the LNB;
 a first QPSK demodulator for demodulating the satellite broadcast signal of the particularly frequency band or the channel selected by the tuner;
 a first Viterbi decoder for decoding the demodulated satellite broadcast signal;
 a first deinterleaver for deinterleaving the decoded satellite broadcast signal;
 a first RS decoder for decoding the deinterleaved satellite broadcast signal;
 a first descrambler for descrambling the decoded satellite broadcast signal; and
 a first TP unit for data-processing the descrambled satellite broadcast signal,
 wherein the first RS decoder outputs the decoded satellite broadcast signal to the first descrambler or to the first data controller.

3. The apparatus of claim 1, wherein the first radio data transceiver comprises:
 a first media access controller (MAC) for receiving the satellite broadcast signal from the first data controller;
 a first RS encoder for coding the satellite broadcast signal inputted to the first media access controller by using a shortened RS code in conformity to the DVB communication standard;
 a first scrambler for scrambling the satellite broadcast signal coded by the first RS encoder or the satellite broadcast signal received from the first MAC;

a first convolutional encoder for coding the scrambled satellite broadcast signal according to a convolutional code;

a first interleaver for interleaving the satellite broadcast signal coded according to the convolutional code;

a first OFDM modulator for modulating the interleaved satellite broadcast signal; and a first RF transceiver unit for converting the modulated satellite broadcast signal into a radio frequency signal and transmitting it to the second radio data transceiver.

4. The apparatus of claim 3, wherein the forward error correction frame using the shortened RS code in conformity to the DVB communication standard comprises;

a MAC header using a shortened RS code having a 32 byte input data and a 16 byte redundancy;

a frame body using a shortened RS code having a 188 byte input data and a 16 byte redundancy; and a 4 byte FCS for checking an error of the frame.

5. The apparatus of claim 1, wherein the second radio data transceiver comprises:

a second RF transceiver for lowering a frequency band of the satellite broadcast signal received from the first radio data transceiver to a base band;

a first OFDM demodulator for demodulating the satellite broadcast signal of which the frequency band has been lowered to the base band;

a second deinterleaver for deinterleaving the demodulated satellite broadcast signal;

a second Viterbi decoder for decoding the deinterleaved satellite broadcast signal;

a second descrambler for descrambling the decoded satellite broadcast signal;

a second media access controller for transmitting the descrambled satellite broadcast signal to the second data controller; and a second RS encoder for coding the satellite broadcast signal received from the second data controller according to a shortened RS code in conformity to the DVB communication standard.

6. The apparatus of claim 1, wherein the second satellite broadcast receiver comprises;

a second RS decoder for decoding the satellite broadcast signal inputted from the second data controller according to a shortened RS code in conformity of the DVB communication standard;

a third descrambler for descrambling the decoded satellite broadcast signal;

a second TP unit for data-processing the descrambled satellite broadcast signal and outputting it; and an MPEG decoder for decoding the data-processed satellite broadcast signal and reproducing a mobile image and a voice, wherein the second RS decoder decodes the satellite broadcast signal and outputs it to the third descrambler or to the second data controller, and the second data controller outputs the satellite broadcast signal inputted from the second radio data transceiver to the second RS decoder if the satellite broadcast signal has been coded according to the shortened RS code in conformity to the DVB communication standard, or outputs the satellite broadcast signal inputted from the second radio data transceiver to the third descrambler or to the MPEG decoder if the satellite broadcast signal has not been coded.

7. The apparatus of claim 6, wherein the forward error correction frame using the shortened RS code in conformity to the DVB communication standard comprises;

a MAC header using a shortened RS code having a 32 byte input data and a 16 byte redundancy;

a frame body using a shortened RS code having a 188 byte input data and a 16 byte redundancy; and a 4 byte FCS for checking an error of the frame.

8. An apparatus for transmitting and receiving an MPEG data using a wireless LAN comprising:

a first cable TV for decoding a broadcast signal inputted through a cable and reproducing a moving picture or a voice;

a first data controller for receiving a decode broadcast signal;

a first radio data transceiver for selectively coding the broadcast signal inputted from the first data controller, converting the inputted broadcast signal or the coded broadcast signal into a radio frequency signal and wirelessly transmitting it;

a second radio data transceiver for receiving a broadcast signal of the radio frequency signal received from the first radio data transceiver;

a second data controller for determining whether the broadcast signal received by the second radio data transceiver has been coded, and controlling a transmission path of the broadcast signal according to the determining result; and a second cable TV for decoding the coded broadcast inputted from the second data controller or data-processing the broadcast signal inputted from the second data controller to reproduce a moving picture and a voice, wherein the first and second cable TVs performs a data communication in conformity to a DVB communication standard, and the first and second radio data transceivers performs a data communication in conformity to an IEEE802 communication standard.

9. The apparatus of claim 8, wherein the first cable TV comprises:

a tuner for selecting a specific frequency band or a channel from the broadcast signal inputted through the cable;

a first QAM demodulator for demodulating the broadcast signal of the specific frequency band or the channel selected by the tuner;

a first deinterleaver for deinterleaving the demodulated broadcast signal;

a first RS decoder for decoding the deinterleaved broadcast signal;

a first descrambler for descrambling the decoded broadcast signal; and a first TP unit for data-processing the descrambled broadcast signal and outputting it to the first data controller, wherein the first RS decoder outputs the decoded broadcast signal to the first descrambler or to the first data controller.

10. The apparatus of claim 8, wherein the first radio data transceiver codes the broadcast signal inputted from the first data controller to a shortened RS code in conformity to the DVB communication standard, converts it to a radio frequency signal and transmits it to the second radio data transceiver, or converts the broadcast signal inputted from the first data controller to a radio frequency signal and transmits it to the second radio data transceiver.

11. The apparatus of claim 8, wherein the second cable TV comprises:
- a second RS decoder for decoding the broadcast signal inputted from the second data controller in conformity to a shortened RS code the DVB communication standard;
- a second descrambler for descrambling the decoded broadcast signal;
- a second TP unit for data-processing the descrambled broadcast signal and outputting it; and
- an MPEG decoder for decoding the data-processed broadcast signal and reproducing a mobile image and a voice, wherein the second RS decoder decodes the broadcast signal and outputs it to the second descrambler or to the second data controller, and the second data controller outputs the broadcast signal inputted from the second radio data transceiver to the second RS decoder if the satellite broadcast signal has been coded according to the shortened RS code in conformity to the DVB standard, or outputs the satellite broadcast signal inputted from the second radio data transceiver to the second descrambler or to the MPEG decoder if the satellite broadcast signal has not been coded.

* * * * *